US006178501B1

(12) United States Patent
Ingalls

(10) Patent No.: US 6,178,501 B1
(45) Date of Patent: *Jan. 23, 2001

(54) METHOD AND APPARATUS FOR INITIALIZING A MEMORY DEVICE

(75) Inventor: Charles L. Ingalls, Meridian, ID (US)

(73) Assignee: Micron Technology. Inc., Boise, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 09/069,486

(22) Filed: Apr. 28, 1998

(51) Int. Cl.[7] .............................. G06F 15/177; G06F 9/00; G06F 9/24
(52) U.S. Cl. ................................. 713/1; 713/2; 711/166; 714/23
(58) Field of Search ........................... 713/1, 2; 709/222; 711/170, 166; 714/23, 36

(56) References Cited

U.S. PATENT DOCUMENTS

| | | |
|---|---|---|
| 3,281,789 | 10/1966 | Willcox et al. . |
| 3,594,733 * | 7/1971 | Lukens, II .................... 340/172.5 |
| 3,950,654 * | 4/1976 | Broedner et al. .................... 307/208 |
| 4,162,449 | 7/1979 | Bouyssounouse et al. ............ 325/55 |
| 5,309,034 * | 5/1994 | Ishibashi .............................. 307/267 |
| 5,454,114 * | 9/1995 | Yach et al. ........................... 395/750 |
| 5,555,166 | 9/1996 | Sher ....................................... 363/49 |
| 5,557,579 | 9/1996 | Raad et al. ........................... 365/226 |
| 5,587,866 | 12/1996 | Yach et al. ............................. 361/90 |
| 5,606,276 * | 2/1997 | McClintock ......................... 327/263 |
| 5,748,616 * | 5/1998 | Riley ................................... 370/242 |
| 5,821,787 * | 10/1998 | McClintock et al. ................ 327/143 |

FOREIGN PATENT DOCUMENTS

| | | |
|---|---|---|
| 0 344 624 A2 | 6/1989 | (EP) . |
| 0 344 624 A3 | 6/1989 | (EP) . |
| 0 319 491 A1 | 7/1989 | (EP) . |

OTHER PUBLICATIONS

Kumar, Virendra, Digital Technology Principles and Practice, John Wiley and Sons, 1995 pp. 248–275.*

* cited by examiner

Primary Examiner—Robert W. Beausoliel, Jr.
Assistant Examiner—Robert G. Crockett
(74) Attorney, Agent, or Firm—Dorsey & Whitney LLP

(57) ABSTRACT

An SDRAM is initialized with an initialization pulse generated in response to a load mode register command that is generated to program a mode register in the SDRAM. Antifuse circuits are read and registers are initialized according to the initialization pulse each time the mode register is programmed. The mode register is programmed in a boot up procedure and in subsequent reboot procedures of a computer system including the SDRAM.

25 Claims, 3 Drawing Sheets

METHOD AND APPARATUS FOR INITIALIZING A MEMORY DEVICE

TECHNICAL FIELD

The invention relates generally to integrated circuit memory devices, and more particularly, to a method and apparatus for initializing a memory device in preparation for operation of the memory device.

BACKGROUND OF THE INVENTION

A conventional memory device is illustrated in FIG. 1. The memory device is a synchronous dynamic random access memory ("SDRAM") that includes an address register 12 receiving either a row address and a bank address bit or a column address on an address bus 14. The address bus 14 is generally coupled to a memory controller (not shown in FIG. 1). Typically, a row address and a bank address are received by the address register 12, and applied to a row address multiplexer 18. The row address multiplexer 18 couples the row address to one of two row address latches 26 depending on the state of the bank address bit. Each of the row address latches 26 stores the row address, and applies it to a row decoder 28, which applies various signals to a respective memory bank array 20, 22 as a function of the stored row address. The row address multiplexer 18 also couples row addresses to the row address latches 26 for the purpose of refreshing memory cells in the arrays 20, 22. The row addresses are generated for refresh purposes by a refresh counter 30 that is controlled by a refresh controller 32. The arrays 20, 22 are comprised of memory cells arranged in rows and columns.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42, which applies a sequence of column addresses to the column address buffer 44 starting at the column address output by the address register 12. In either case, the column address buffer 44 applies a column address to a column decoder 48, which applies various column signals to respective sense amplifiers and associated column circuits 50 and 52 for the respective arrays 20, 22.

Data to be read from one of the arrays 20, 22 are coupled from the arrays 20, 22, respectively, to a data bus 58 through the column circuit 50 or 52, respectively, and a read data path that includes a data output register 56. Data to be written to one of the arrays 20, 22 are coupled from the data bus 58 through a write data path, including a data input register 60, to one of the column circuits 50, 52 where they are transferred to one of the arrays 20, 22, respectively. A mask register 64 may be used to selectively alter the flow of data written to the arrays 20, 22.

The above-described operation of the SDRAM 10 is controlled by a control logic circuit 66 which includes a command decode circuit 68 and a mode register 69. The control logic circuit 66 is responsive to high level command signals received from a control bus 70 through the command decode circuit 68. The high level command signals, which are typically generated by the memory controller, are a chip select signal CS*, a write enable signal WE*, a row address strobe signal RAS*, and a column address strobe signal CAS*. The memory controller also typically provides a clock enable signal CKE* and a clock signal CLK through the control bus 70 to the control logic circuit 66. The "*" designates the signal as active low. The control logic circuit 66 generates a sequence of command signals responsive to the high level command signals to carry out a function (e.g., a read or a write) designated by each of the high level command signals. The command signals, and the manner in which they accomplish their respective functions, are conventional. Therefore, in the interest of brevity, a further explanation of the command signals will be omitted.

At the beginning of its operation, the SDRAM 10 is supplied with an operating voltage Vcc, which rises from 0 volts to about 3 volts, and the SDRAM 10 undergoes a power up procedure, also called a boot up procedure, to initialize it for operation. As Vcc is rising, the control logic circuit 66 generates a power up pulse which is a single pulse having a duration defined between a leading edge and a trailing edge. The power up pulse may be generated by an RC circuit. The power up pulse may also be generated by a level translator based on the rising Vcc, or by a combination of a level translator and an RC circuit. The power up pulse is applied to override most circuitry in the SDRAM 10 to place the circuitry in a known state.

The control logic circuit 66 includes a substantial number of antifuse circuits in several antifuse banks 90 located between the address latches 26, 40, and the respective decoders 28, 48. The antifuse circuits in the antifuse banks 90 are used to identify defective rows or columns in the SDRAM 10. The antifuse circuits are arranged in groups of 8, and each group may be programmed to provide an address of a defective row or column. Once programmed, each antifuse circuit must be read or strobed by a read signal before it can provide a digital value in an address. The read signal is a single pulse with a duration that must be long enough to properly read each antifuse circuit. During the boot up procedure the read signal is generated in the control logic circuit 66 in response to the power up pulse, and its duration is approximately equal to the duration of the power up pulse.

The SDRAM 10 also includes a large number of registers 92 that are programmed with data during its operation to define modes of operation for each element in the SDRAM 10. The registers 92 include an input mode register, an output mode register, a register for the output buffers, and a register for initializing the control logic circuit 66. These and many more registers 92 are located across the SDRAM 10 as needed. The registers 92 are made up of latches that are in an unknown state prior to the boot up procedure and are initialized or put into a known state by the power up pulse before the SDRAM 10 begins operating. The initialization of the registers 92 prevents elements in the SDRAM 10 from behaving in an uncontrolled manner. For example, the register for an output buffer indicates when data is to be driven onto a bus and when the output buffer is to be tri-stated. If the output buffer was allowed to drive data onto the bus in a random fashion a conflict over buses in the SDRAM 10 would occur, leading to bus contention and possibly other problems.

A proper operation of the SDRAM 10 depends on the duration of the power up pulse. If there is a spike in the rising Vcc or Vcc is not generated with the appropriate power ramp rate, the power up pulse will not be long enough to support a reading of the antifuse circuits or to initialize the registers 92. In addition, logic in the SDRAM 10 will not operate when Vcc is below about 1.5 volts, or below 50% of a steady Vcc. In either case, the antifuse circuits may not be read correctly and the registers 92 may not be initialized if the power up pulse is too short, with the result that the SDRAM 10 will not operate properly.

The SDRAM 10 is also initialized during a reboot procedure of a computer including the SDRAM 10. The reboot procedure, also called a hot boot procedure, reinitializes the computer at the direction of a user while Vcc is maintained at a stable level and not interrupted and no power-up pulse is generated. Without the power-up pulse, the registers 92 are not reinitialized and the antifuse circuits are not read in the reboot procedure. The SDRAM 10 may start operating in an undefined mode after the reboot procedure because the registers 92 retain data which may conflict with instructions received during the reboot procedure.

SUMMARY OF THE INVENTION

In accordance with the present invention, a method and apparatus for initializing a memory device with a reset pulse are provided. The reset pulse is generated in response to a trigger signal which may be a load mode register command. The load mode register command may be generated to program a mode register in the memory device in response to command signals. The reset pulse may be generated in a latch circuit as a single pulse with a duration longer than a duration of a single pulse of the load mode register command. The reset pulse may be applied to initialize registers and read antifuses in the memory device.

DETAILED DESCRIPTION OF THE INVENTION

Figure 1:
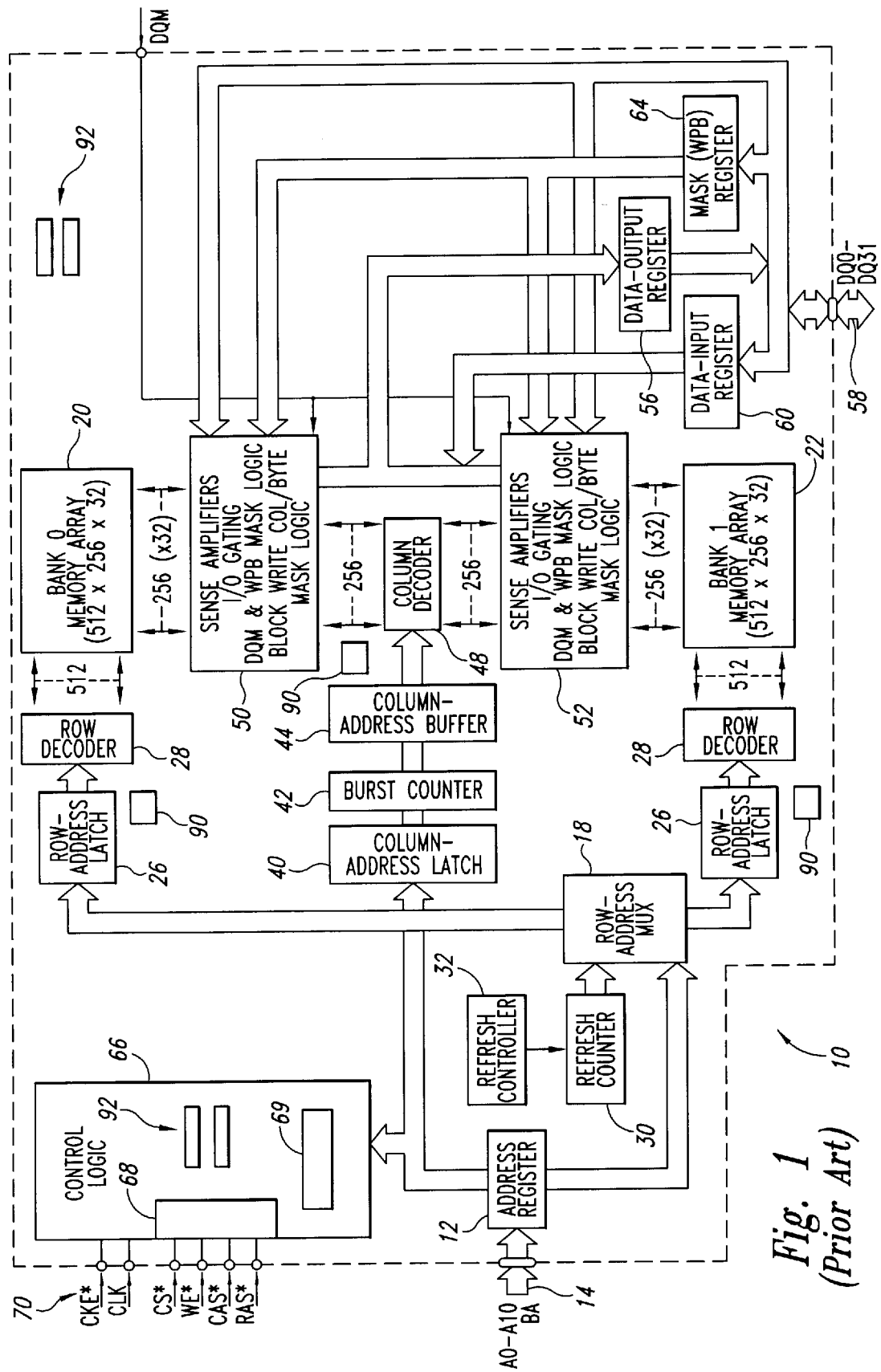
FIG. 1 is a block diagram of a memory device according to the prior art.
Figure 2:
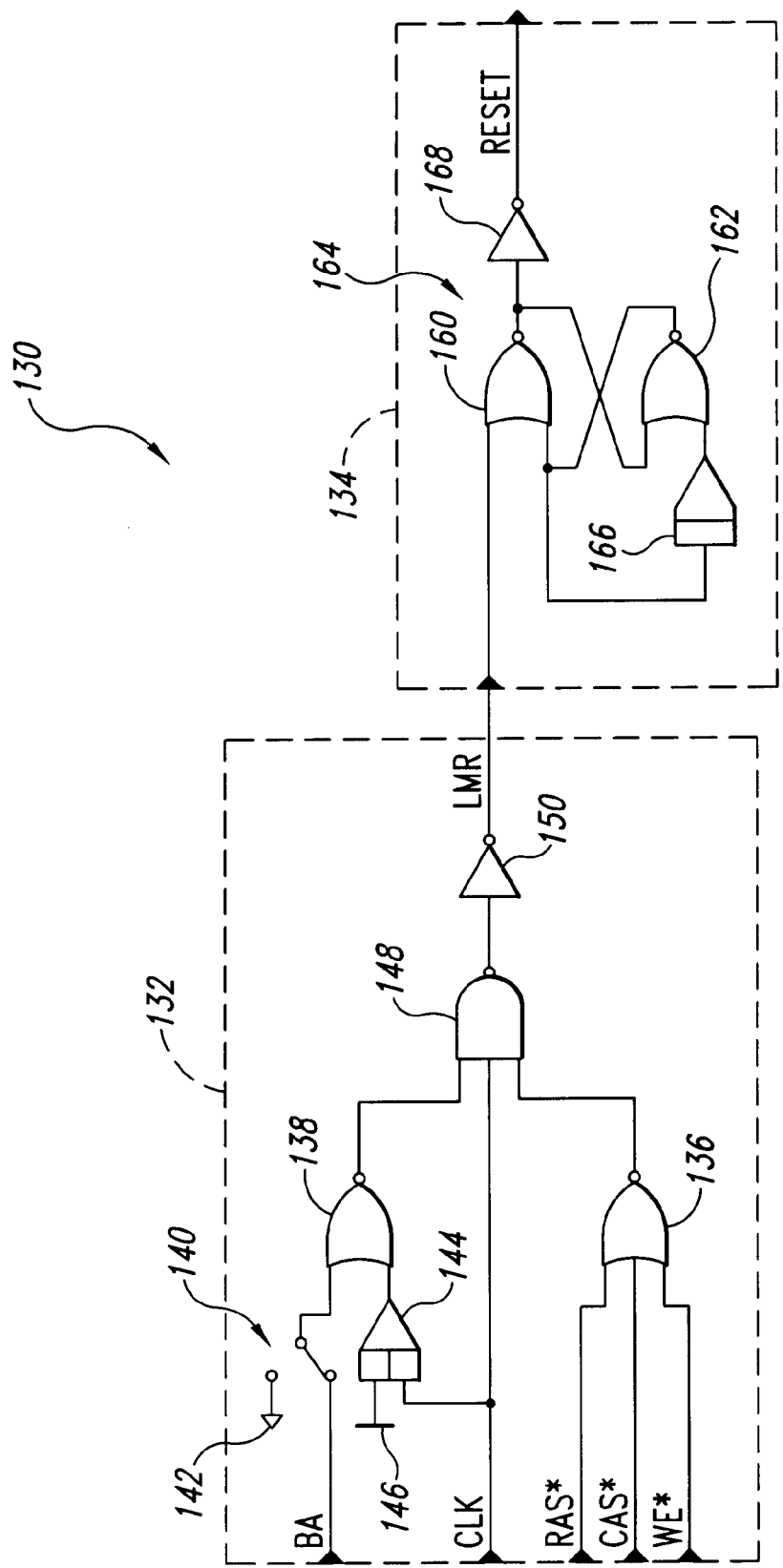
FIG. 2 is a block diagram of a circuit for generating a reset pulse according to one embodiment of the present invention.

According to an embodiment of the invention, a reset pulse is generated by an initialization circuit 130 shown in FIG. 2 that is included in the control logic circuit 66 of the SDRAM 10 of FIG. 1 in response to a load mode register command (LMR) to initialize the SDRAM 10. The reset pulse is applied to generate a read signal to read antifuse circuits, to initialize registers, and to start voltage pumps among other tasks in the SDRAM 10. The reset pulse performs the same functions as the power up pulse.

The LMR is a single pulse of a limited duration that is generated by the control logic circuit 66 in response to a selected set of high-level command signals. The mode register 69 is programmed with data from the address bus 14 during the LMR pulse. The data define a specific mode of operation of the SDRAM 10 by defining such operating parameters as a burst length, a burst type, a CAS latency, an operating mode, and a write burst mode. The mode register 69 is programmed any time the SDRAM 10 is initialized. For example, the mode register 69 is programmed during both boot up and reboot procedures for a computer including the SDRAM 10. The use of an LMR pulse to program a mode register in an SDRAM is well-known to those skilled in the art, and will not be further described herein for purposes of brevity.

The initialization circuit 130 shown in FIG. 2 includes a pulse generator 132 for generating an LMR pulse and a latch circuit 134 for generating the reset pulse. The latch circuit 134 generates the reset pulse to be longer than the LMR pulse.

The pulse generator 132 generates the LMR pulse based on the bank activate signal BA, the clock signal CLK, the row address strobe signal RAS*, the column address strobe signal CAS*, and the write enable signal WE* provided to the control logic circuit 66. The bank activate signal BA is generated in the control logic 66 when the address in the SDRAM 10 is being accessed. When an address is access the bank activate signal BA is high, and other times it is low. A The signals RAS*, CAS*, and WE* are provided to inputs of a first NOR gate 136, which outputs a high to enable the generation of the LMR pulse when each of the signals RAS*, CAS*, and WE* are low. A second NOR gate 138 has a first input connected to a switch 140 which may be positioned to receive the bank activate signal BA, or connected to a ground 142. The position of the switch 140 is set during assembly of the SDRAM 10 including the circuit 130. The first input of the second NOR gate 138 must also be low in order to enable the generation of the LMR pulse, and it is always low if the switch 140 is connected to the ground 142. If the switch 140 is coupled to receive the bank activate signal BA then the pulse generator 132 is enabled to generate the LMR pulse only when the bank activate signal BA is low to indicate that the SDRAM 10 is not being accessed. If the bank activate signal BA is high, the SDRAM 10 is being accessed. The pulse generator 132 is then disabled so that it cannot generate the LMR pulse. A second input of the second NOR gate 138 is connected to an output of a delay circuit 144, which has a first input connected to a reference voltage 146 and a second input connected to receive the clock signal CLK. The second NOR gate 138 thus outputs a high when a delayed clock signal at the output of the delay circuit 144 is low and the SDRAM 10 is not being accessed.

The pulse generator 132 further includes a NAND gate 148 having three inputs, the first coupled to an output of the first NOR gate 136, the second coupled to an output of the second NOR gate 138, and the third coupled to receive the clock signal CLK. The NAND gate 148 generates the LMR pulse through an inverter 150 when each of its inputs is high. Therefore, the LMR pulse is initiated at an output of the inverter 150 in response to the clock signal CLK when the outputs of the NOR gates 136, 138 are high.

Prior to a rising edge of the clock signal CLK the output of the delay circuit 144 is low, and goes high in response to the rising edge of the clock signal CLK after a selected delay period. When the output of the delay circuit 144 goes high the output of the second NOR gate 138 goes low thereby terminating the LMR pulse. The pulse generator 132 thus generates an LMR pulse having a duration determined by the delay period set by the delay circuit 144. The LMR pulse is never longer than a single clock pulse because a low clock signal CLK will also end the LMR pulse.

The latch circuit 134 includes a first NOR gate 160 and a second NOR gate 162 coupled to each other to form a flip flop 164. The flip flop 164 is reset by the LMR pulse from the pulse generator 132 coupled to an input of the first NOR gate 160. A delay circuit 166 is connected between an output and an input of the second NOR gate 162 so that the flip flop 164 is set following a selected period of delay after being reset by the LMR pulse. The reset pulse is generated at an output of an inverter 168.

The latch circuit 134 operates to generate the reset pulse in the following manner. Before the arrival of the LMR pulse, the first input of the first NOR gate 160 is low as is an output of the second NOR gate 162. The output of the first NOR gate 160 is high thereby maintaining the output of the inverter 168 low. The flip flop 164 is thus initially in a set condition. The LMR pulse drives the output of the first NOR gate 160 low to reset the flip flop 164, and the inverter 168 outputs a high to start the reset pulse. The low at the output of the first NOR gate 160 also drives the output of the second NOR gate 162 high to latch the output of the first NOR gate 160 low. The high at the output of the second NOR gate 162 is also applied to the input of the delay circuit 166. After a selected delay period defined by the delay circuit 166 the high at the input of the delay circuit 166 is applied to the second input of the second NOR gate 162 thereby setting the flip flop 164. The output of the second NOR gate 162 is then driven low to drive the output of the first NOR gate 160 high thereby causing the reset pulse to be terminated at the output of the inverter 168. In this manner, the latch circuit 134 generates the reset pulse to be longer than the LMR pulse due to the delay circuit 166.

The latch circuit 134 is employed to generate the reset pulse to be longer than the LMR pulse, which is less than a single clock pulse, and thus too short to read the antifuse circuits or initialize the registers 92 in the SDRAM 10. The LMR pulse could be generated by the pulse generator 132 to be long enough to carry out these tasks, but a longer LMR pulse is not capable of carrying out other tasks for which it is generated. For example, as described above, the mode register 69 is programmed with data from the address bus 14 during the LMR pulse. Data on the address bus 14 changes rapidly such that the data for programming the mode register 69 is quickly replaced with other data. If the LMR pulse were too long, the mode register 69 might be programmed with incorrect data. The duration of the LMR pulse must therefore be shorter than a single clock pulse.

The reset pulse is advantageously generated by the circuit 130 to be long enough to generate a read signal to properly read the antifuse circuits in the antifuse banks 90 and initialize the registers 92 in the SDRAM 10. The reset pulse is generated in response to the LMR pulse after Vcc has reached a stable level and the power up pulse is complete, and is capable of remedying any defect in the power up pulse. Since Vcc is stable logic in the antifuse circuits and the registers 92 will be fully operational when initialized by the reset pulse. A stable Vcc also ensures that the reset pulse is not cut short as the power up pulse may be by voltage spikes or an inappropriate power ramp rate.

Another advantage of generating the reset pulse in the circuit 130 is that the LMR pulse is generated during both boot up and reboot procedures to program the mode register 69 with new data. As described above, in a conventional SDRAM 10 the antifuse circuits are read and the registers 92 are initialized by the power up pulse, which is only generated during the boot up procedure. During a reboot procedure the registers 92 are not initialized and retain old data. In addition, the antifuse circuits are not read. If the new data in the mode register 69 conflicts with the old data in the registers 92 the SDRAM 10 may begin operating in an undefined mode after the reboot procedure. The generation of the reset pulse in the circuit 130 according to the embodiment of the invention avoids this problem by initializing the registers 92 and reading the antifuse circuits each time the mode register 69 is programmed by the LMR pulse in both boot up and reboot procedures.

Figure 3:
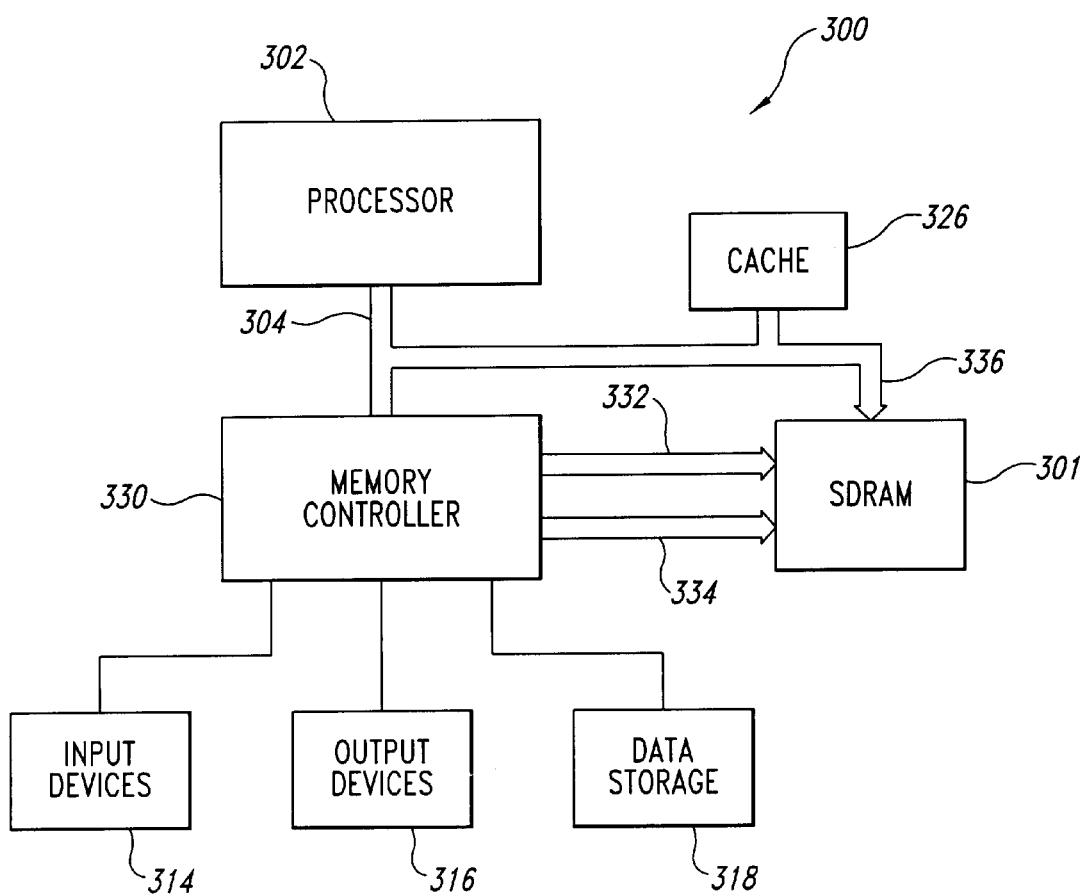
FIG. 3 is a block diagram of a computer system including the circuit for generating a reset pulse of FIG. 2.

FIG. 3 is a block diagram of a computer system 300 including an SDRAM 301 having a circuit for generating a reset pulse similar to the circuit 130 shown in FIG. 2. The computer system 300 includes a processor 302 for performing various computing functions, such as executing specific software to perform specific calculations or tasks. The processor 302 includes a processor bus 304 that includes an address bus, a control bus, and a data bus. In addition, the computer system 300 includes one or more input devices 314, such as a keyboard or a mouse, coupled to the processor 302 to allow an operator to interface with the computer system 300. The computer system 300 also includes one or more output devices 316 coupled to the processor 302, such as a printer or a video terminal. One or more data storage devices 318 may also be coupled to the processor 302 to allow the processor 302 to store data or retrieve data from internal or external storage media (not shown). Examples of typical storage devices 318 include hard and floppy disks, tape cassettes, and compact disk read-only memories (CD-ROMs). The processor 302 is also coupled to a cache memory 326, which is a static random access memory ("SRAM"), and to the SDRAM 301 through a memory controller 330. The memory controller 330 includes a control bus 332 and an address bus 334 which are coupled to the SDRAM 301. A data bus 336 is coupled between the SDRAM 301 and the processor bus 304.

Although the present invention has been described with reference to several embodiments shown in the drawings, the invention is not limited to these embodiments. For example, circuits other than those shown in FIG. 2 can be used to generate a load mode register command and a reset pulse. Therefore, the invention is limited only by the appended claims, which include within their scope all equivalent devices or methods which operate according to the principles of the invention as described.

What is claimed is:

1. An initialization circuit adapted for use in a memory device control logic circuit, the control logic circuit having a plurality of inputs coupled to receive respective high level command signals, and a mode register that is structured to store mode data responsive to a load mode register command, the initialization circuit comprising:
   a first circuit having a plurality of inputs coupled to receive, respectively, a group of the high level command signals, the first circuit being structured to generate the load mode register command at an output based on the group of high level command signals; and
   a second circuit having an input coupled to the output of the first circuit to receive the load mode register command, the second circuit being structured to generate at an output a reset pulse responsive to the load mode register command.

2. The initialization circuit of claim 1 wherein the first circuit comprises a plurality of logic gates having a plurality of inputs coupled to receive the group of high level command signals and being structured to generate the load mode register command having a single pulse with a first duration.

3. The initialization circuit of claim 2 wherein the second circuit comprises a plurality of logic gates coupled to receive the load mode register command and being structured to generate the reset pulse as a single pulse with a second duration longer than the first duration of the load mode register command.

4. The initialization circuit of claim 3 wherein the second circuit comprises a latch circuit including a flip flop and a delay circuit, the latch circuit having an input coupled to the output of the first circuit to receive the load mode register command and an output and being structured to generate the reset pulse at its output by extending the pulse of the load mode register command by a period of delay, the period of delay being set by the delay circuit.

5. The initialization circuit of claim 4 wherein the latch circuit comprises:
   a first NOR gate having a first input coupled to the output of the first circuit to receive the load mode register command, a second input, and an output;

a second NOR gate having a first input connected to the output of the first NOR gate, an output connected to the second input of the first NOR gate, and a second input;

a delay circuit having an input connected to the second input of the first NOR gate and an output connected to the second input of the second NOR gate; and an inverter having an input connected to the output of the first NOR gate and an output, the latch circuit being structured to generate the reset pulse at the output of the inverter.

6. A circuit for generating an initialization pulse in a memory device, the memory device having a control logic circuit, the circuit comprising:

a first pulse generator circuit having a plurality of inputs coupled to receive respective externally applied command signals, the first pulse generator circuit being structured to generate at an output a trigger signal based on the command signals; and a second pulse generator circuit having an input coupled to the output of the first pulse generator circuit to receive the trigger signal, the second pulse generator circuit being structured to generate at an output the initialization pulse based on the trigger signal.

7. The circuit of claim 6 wherein the first pulse generator circuit comprises a plurality of logic gates having a plurality of inputs coupled to receive the command signals and being structured to generate a load mode register command for programming mode data into a mode register in the control logic circuit, the load mode register command having a single pulse with a first duration.

8. The circuit of claim 7 wherein the second pulse generator circuit comprises a plurality of logic gates coupled to receive the load mode register command and being structured to generate the initialization pulse as a single pulse with a second duration longer than the first duration of the load mode register command.

9. The circuit of claim 8 wherein the second circuit comprises a latch circuit including a flip flop and a delay circuit, the latch circuit having an input coupled to receive the load mode register command and an output, the latch circuit being structured to generate the initialization pulse at its output by extending the pulse of the load mode register command by a period of delay, the period of delay being set by the delay circuit.

10. A computer system comprising:

a processor having a processor bus;

an input device coupled to the processor through the processor bus and adapted to allow data to be entered into the computer system;

an output device coupled to the processor through the processor bus and adapted to allow data to be output from the computer system; and a memory device coupled to the processor through the processor bus, the memory device comprising:

at least one array of memory cells arranged in rows and columns, each of the rows having a row line and each of the columns having a pair of complementary digit lines;

a row address circuit coupled to the address bus for activating a row line corresponding to a row address coupled to the row address circuit through the address bus;

a column address circuit coupled to the address bus for selecting a column for a memory access that corresponds to a column address coupled to the column address circuit through the address bus;

a control logic circuit having a plurality of inputs coupled to receive respective high level command signals and a mode register that is structured to store mode data responsive to a load mode register command; and an initialization circuit adapted for use in the memory device, the initialization circuit comprising:

a first circuit having a plurality of inputs coupled to receive, respectively, a group of the high level command signals, the first circuit being structured to generate the load mode register command at an output based on the group of high level command signals; and a second circuit having an input coupled to the output of the first circuit to receive the load mode register command, the second circuit being structured to generate at an output a reset pulse responsive to the load mode register command.

11. The computer system of claim 10 wherein the first circuit comprises a plurality of logic gates having a plurality of inputs coupled to receive the group of high level command signals and being structured to generate the load mode register command having a single pulse with a first duration.

12. The computer system of claim 11 wherein the second circuit comprises a plurality of logic gates coupled to receive the load mode register command and being structured to generate the reset pulse as a single pulse with a second duration longer than the first duration of the load mode register command.

13. The computer system of claim 12 wherein the second circuit comprises a latch circuit including a flip flop and a delay circuit, the latch circuit having an input coupled to the output of the first circuit to receive the load mode register command and an output and being structured to generate the reset pulse at its output by extending the pulse of the load mode register command by a period of delay, the period of delay being set by the delay circuit.

14. A method for initializing a memory device having a control logic circuit and a mode register that is structured to store mode data for the memory device, the method comprising:

generating a load mode register command in response to a plurality of high level command signals provided to the control logic circuit;

programming the mode register with mode data in response to the load mode register command;

generating a reset pulse in response to the load mode register command; and coupling the reset pulse to initialize the memory device.

15. The method of claim 14 wherein the step of generating a load mode register command comprises generating a load mode register command having a single pulse with a first duration.

16. The method of claim 15 wherein the step of generating a reset pulse comprises generating a reset pulse in response to the load mode register command as a single pulse with a second duration longer than the first duration of the load mode register command.

17. The method of claim 14 wherein the step of generating a reset pulse comprises:

receiving the load mode register command having a single pulse with a first duration at an input of a latch circuit; and generating a reset pulse at an output of the latch circuit as a single pulse with a second duration longer than the first duration of the load mode register command.

18. The method of claim 17 wherein the step of generating a reset pulse further comprises extending the second duration of the reset pulse to be longer than the first duration of the load mode register command by a period of delay provided by a delay circuit in the latch circuit.

19. The method of claim 14, further comprising:
reading antifuse circuits in the memory device based on the reset pulse; and
initializing registers and voltage pumps in the memory device based on the reset pulse.

20. A method of operating a computer system having a memory device, including a control logic circuit and a mode register that is structured to store mode data for the memory device, the method comprising:
generating a load mode register command in response to a plurality of high level command signals provided to the control logic circuit;
programming the mode register with mode data in response to the load mode register command;
generating a reset pulse in response to the load mode register command; and
coupling the reset pulse to initialize the memory device.

21. The method of claim 20 wherein the step of generating a load mode register command comprises generating a load mode register command having a single pulse with a first duration.

22. The method of claim 20 wherein the step of generating a reset pulse comprises generating a reset pulse in response to the load mode register command as a single pulse with a second duration longer than the first duration of the load mode register command.

23. The method of claim 20 wherein the step of generating a reset pulse comprises:
receiving the load mode register command having a single pulse with a first duration at an input of a latch circuit; and
generating a reset pulse at an output of the latch circuit as a single pulse with a second duration longer than the first duration of the load mode register command.

24. The method of claim 20 wherein the step of generating a reset pulse further comprises extending the second duration of the reset pulse to be longer than the first duration of the load mode register command by a period of delay provided by a delay circuit in the latch circuit.

25. The method of claim 20, further comprising:
reading antifuse circuits in the memory device based on the reset pulse; and
initializing registers and voltage pumps in the memory device based on the reset pulse.

* * * * *